(12) United States Patent
Tsecouras

(10) Patent No.: US 6,456,127 B1
(45) Date of Patent: Sep. 24, 2002

(54) ADAPTIVE PULSE FRAME RATE FREQUENCY CONTROL FOR MINIMIZATION OF ELECTRO-MAGNETIC CONTAMINATION IN INTEGRATED SWITCHING AMPLIFIER SYSTEMS

(75) Inventor: Michael J. Tsecouras, Carrollton, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/934,102

(22) Filed: Aug. 21, 2001

Related U.S. Application Data (60) Provisional application No. 60/236,870, filed on Sep. 29, 2000.

(51) Int. Cl.$^7$ ................................................. H03K 4/48
(52) U.S. Cl. ........................ 327/133; 327/131; 327/140
(58) Field of Search ................................ 327/131, 133, 327/134, 135, 140

(56) References Cited

U.S. PATENT DOCUMENTS 4,585,951 A * 4/1986 Wurzburg .................... 327/140
4,611,176 A * 9/1986 Jatko et al. ................... 327/133

* cited by examiner

*Primary Examiner*—Dinh T. Le
(74) *Attorney, Agent, or Firm*—W. Daniel Swayze, Jr.; W. James Brady; Frederick J. Telecky, Jr.

(57) ABSTRACT

A system and method of integrating switching amplifiers into systems with low amplitude front-end tuners to eliminate shielding and EMI filtering associated with signals, power and ground. An adaptive frequency programmable pulse frame rate switching amplifier scheme using either look-up tables or appropriate algorithms, ensures by design, the elimination of critical interference frequency generation.

29 Claims, 5 Drawing Sheets

ADAPTIVE PULSE FRAME RATE FREQUENCY CONTROL FOR MINIMIZATION OF ELECTRO-MAGNETIC CONTAMINATION IN INTEGRATED SWITCHING AMPLIFIER SYSTEMS

This application claims priority under 35 USC §119(e)(1) of Provisional Application No. 60/236,870, filed Sep. 29, 2000.

BACKGROUND OF THE INVENTION

1. Field of the Invention

This invention relates generally to switching amplifiers, and more particularly to a system and method of adaptive pulse frame rate frequency control for minimization of electromagnetic contamination in integrated switching amplifier systems.

2. Description of the Prior Art

Critical frequency band interference is a natural byproduct of switching amplifiers, and is independent of specific architectural approaches and implementations associated with the switching amplifiers. This characteristic is particularly problematic when integrating switching amplifiers into systems with low amplitude front-end-tuners, such as AM/FM/TV band systems. Such integration is presently possible using expensive and bulky metal shielding in association with liberal application of EMI filters on signals, power and ground.

Understanding the key contributors to the EMI spectrum generation accommodates design of a system that can predictably avoid specific frequency spectra. Integrating switching amplifiers into a data communication system generates noise at frame pulse rate, also including the even and odd harmonics of the pulse frame frequency. The noise energy is emitted from the silicon die and is affected by the particular board layout using the switching amplifier(s). The amplitude associated with the noise energy is proportional to the loop areas of the power, signal and ground return areas. In view of the foregoing, it can be appreciated that near field containment of EMI energy due to the contamination of power and ground requires significant design effort. Many EMI filters and shields must, for example, be utilized to ensure that a switching amplifier sub-system can co-exist with a high receptive front end, such as that associated with RF tuner devices. Such tuners however, have selectivity and certain frequency rejection circuitry integrated therein to avoid degradation due to cross-talk (bleed-through) of neighboring stations. Elimination of frequencies generated by a switching amplifier therefore only requires elimination of frequencies which are in the pass band of the tuner's user-selected frequency. Practically, caution must be exercised to also avoid nearby frequencies to local oscillator frequencies and intermediate frequencies within the IF band generally used in associated receiver technologies.

EMI generally is always present at some amplitude; and frequency spurs associated with such EMI is easily correlated with switching rates and pulse frame rates for communication systems impacted by such EMI. Modern systems passing EMI generally require the system enclosure, input and output signal cables, and AC mains to limit generation of EMI energy in order to conform with specific country or regional EMI standards. Even the most robust EMI compliant systems suffer from sources of self-contamination however, due to near field and board level EMI conducted and radiated emissions.

Brute force methods are useful to reduce the amplitude of EMI noise signals generated by a switching amplifier. These methods, however, add cost and are time consuming to design and optimized. Various manufacturing tolerances must be considered to ensure a robust design for high volume manufacturing and typically add to the system weight, cost and design cycle time. Some of these methods include, but are not limited to 1) use of extensive metal shielding providing a 'Faraday cage' around the emitting source, 2) use of output L-C lowpass fitters, e.g. $2^{nd}$ order to $6^{th}$ order, with $4^{th}$ order being most commonly used, 3) use of high frequency (EMI) filters using ferrite beads, T-filters and the like on power and ground points, and 4) use of EMI filtered connectors to pass all power and signals into and out of the metal Faraday cage.

Spread spectrum switching controller techniques are useful as well to reduce the amplitude of EMI noise signals generated by a switching amplifier. Although such techniques reduce energy in many frequency bands, these techniques often retain sufficient energy in certain critical energy bands and therefore still require use of additional brute force EMI containment devices such as described above.

In view of the above, there is a need for an adaptive frequency programmable pulse frame rate switching amplifier capable of ensuring by design, the elimination of critical interfererce frequency generation. Such a switching amplifier should generate EMI noise signals in certain critical frequency bands only outside frequencies of interest.

SUMMARY OF THE INVENTION

The present invention is directed to a switching amplifier that inherently does not produce EMI in certain critical frequency bands. The switching amplifier produces EMI only in frequency bands that are outside the frequency of interest. Two parameters necessary to ensure that interference in a certain frequency band of interest is not generated include 1) the 'keep out band' for EMI and 2) the frequency range of the switching amplifier necessary to meet acceptable THD, efficiency and frequency response. The 'keep out band' is known by application and is generally related to the frequency of the AM radio station or FM radio station, for example, that the user would like to listen to or record. Similarly, the 'keep out band' could be related to a television station that could either be viewed or recorded.

Knowing the frequency of the 'keep out band' for EMI via user selection as described above, the present system and method of adaptive pulse frame rate frequency control can then be used to change the switching amplifier frequency when the user selects a new frequency band for listening, recording or viewing. This can be done by changing the pulse frame frequency.

Fixed frequency switched amplifiers have predictable frequencies associated with generation of the EMI noise spurs (spikes). Regardless of whether AM, FM, or TV applications are used, there is only a small frequency band with carrier and modulated frequencies (information content) for a given 'keep out band'. These applications can all be accommodated with a system in which the pulse-frame frequency need only change by less than a factor of two. Optimization of normal output L-C filters can therefore remain fixed, even though the pulse frame frequency may be changed to a new value dependent on user selection of the AM/FM/TV frequency.

More specifically, the present invention is an adaptive pulse frame rate frequency control system that receives user selected frequency information such as AM, FM, or TV signals. The control system incorporates at least one switching amplifier and also includes a look-up table or algorithm to determine a proper pulse frame frequency necessary to eliminate critical frequency band interference by the at least one switching amplifier. According to one embodiment, output control data bits for proper pulse-frame frequency selection are decoded and used to control a triangle waveform generator frequency.

In one aspect of the invention, a method and associated system are implemented to eliminate critical frequency band interference by a switching amplifier such that overall channel performance is not limited as a result of small changes in system frequency response and system dynamic range due to changing the pulse frame frequency. Generally, actual information being received by the present adaptive pulse frame rate frequency control system will already be limited in both bandwidth and dynamic range from the source, e.g. station, cable.

In still another aspect of the invention, an adaptive pulse frame rate frequency control system is implemented in which there is not a need to have a unique pulse-frame frequency for each AM/FM/TV station selected due to the actual number of 'keep out band' frequencies and mathematical relationships (ratios) of those to one another.

In yet another aspect of the invention, a method and associated structure are implemented to eliminate critical frequency band interference by a switching amplifier in which pulse-frame frequencies for each AM/FM/TV station are mapped to specific user-selected AM/FM/TV stations via a look-up table to determine which pulse frame to implement.

Still another aspect of the invention is associated with a system and method implemented to eliminate critical frequency band interference by a switching amplifier in which pulse-frame frequencies for each AM/FM/TV station are mapped to specific user-selected AM/FM/TV stations via algorithmic calculations to determine which pulse frame to implement.

BRIEF DESCRIPTION OF THE DRAWINGS

Other aspects and features of the present invention and many of the attendant advantages of the present invention will be readily appreciated as the same become better understood by reference to the following detailed description when considered in connection with the accompanying drawings in which like reference numerals designate like parts throughout the figures thereof and wherein.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1:
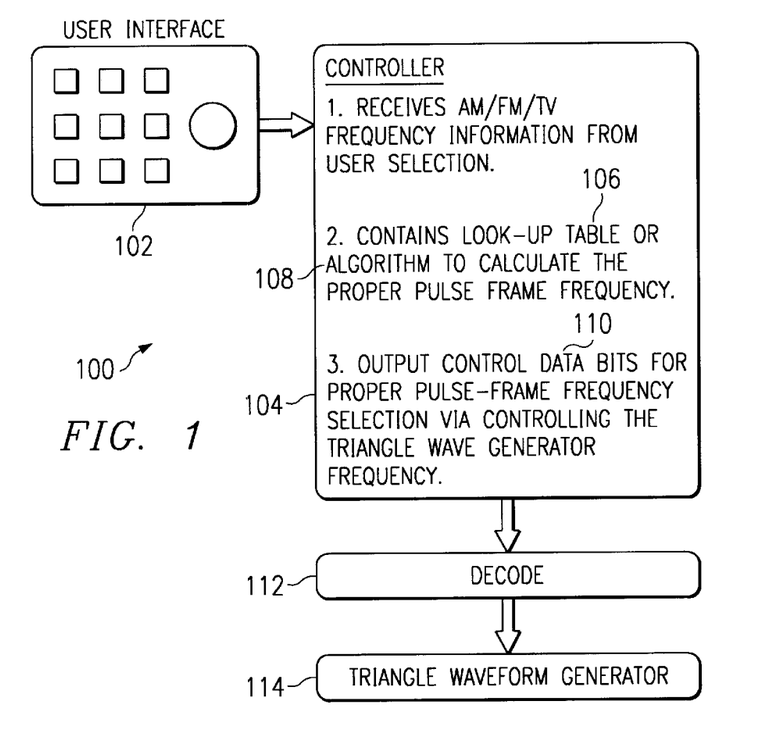
FIG. 1 is a high level block diagram illustrating one embodiment of the present adaptive pulse frame rate frequency control process.

FIG. 1 is a high level block diagram illustrating one embodiment of the present adaptive pulse frame rate frequency control process 100. The process 100 commences when a user provides frequency information via a user interface such as a keypad 102 to a controller 104. The controller 104 can be a computer or otherwise include: a data processing device such as a CPU, micro-controller, DSP, or other device capable of processing the user selected frequency information. The controller 104 can include a look-up table 106 of frequencies or an algorithm 108 capable of calculating the proper pulse frame frequency in response to the user selected frequency information. The look-up table 106 of frequencies (e.g., triangle wave) versus AM/FM/TV stations desired for listening/recording can be constructed to minimize interference in the keep-out bands for the frequencies related to the source selected. The look-up table 106 most preferably contains desired pulse frame frequencies, which neither the pulse frame frequency nor its harmonics (including the span frequencies related to the bandwidth of the informnation) can be either multiples or sub-multiples of the AM/FM/TV band frequencies as selected by the user. As stated herein before, selection of the programmed pulse frame frequency(s), the frequency multiple(s) and sub-multiple(s) should also not interfere with the IF and LCO as required by the receiver type selected. After processing the user selected frequency information, the controller 104 generates output control data bits 110 for proper pulse-frame frequency selection. The output control data bits 110 are then communicated to a decoder 112 to generate the requisite control data. Thus, when the user selects a given station on the AM/FM/TV band, the controller 104 commences to retrieve the proper pulse frame rate that will not interfere with the frequencies of the selected program material. The controller 104 updates a triangle waveform generator 114 using the control data generated via decoder 112 to obtain the new proper triangle wave frequency. The triangle waveform generator 114 continues to output this frequency until the user selects another source. At that point, the controller 104 again retrieves the proper pulse frame rate that will not interfere with the frequencies of the newly selected program material. The controller 104 updates the triangle wave generator with the newest values necessary to obtain the newest proper triangle wave frequency. Each time another selection is made, the look-up table 106 is retrieved, and a correct triangle waveform frequency is selected.

Figure 2:
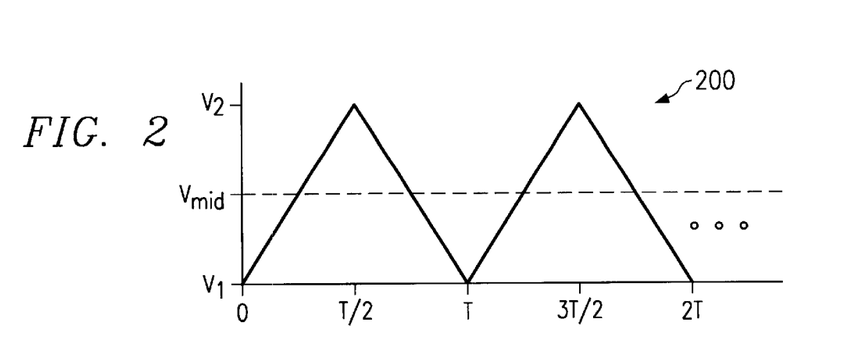
FIG. 2 is diagram illustrating a common triangular waveform.

FIG. 2 is diagram illustrating a common triangular waveform 200 that will be used herein below to further describe details of the present invention. The waveform 200 frequency can be seen to be 1/T. Certain waveform 200 characteristics will be assumed only for purposes of more easily describing details of the present invention. It will be assumed, for example, that $V_{mid}=0V$, $|V_i|>V_2$, and that $|V_1|=|V_2|$. The waveform 200 is generated via the triangle waveform generator 114 depicted in FIG. 1 and will be described in more detail herein below with reference to the remaining figures.

Figure 3:
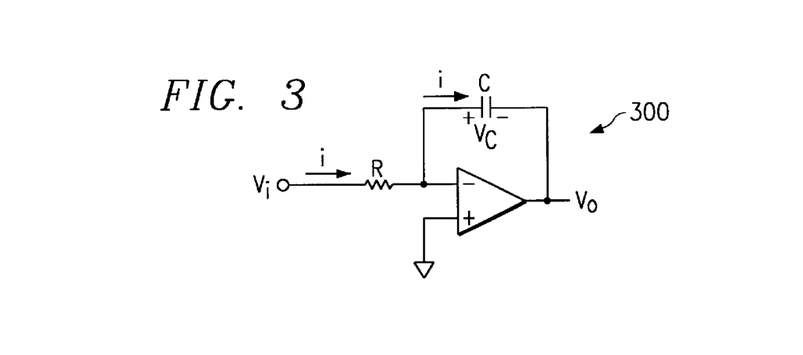
FIG. 3 is a schematic diagram illustrating a common triangle wave inverting integrator.

FIG. 3 is a schematic diagram illustrating a common triangle wave inverting integrator 300. The transfer function H(s) can be represented by equation 1 set forth below.

$$H(s) = \frac{-1}{(RC)s} \quad (1)$$

For linear operational amplifier operation of the inverting integrator 300, $$i = \frac{V_i}{R} \quad (2)$$

and $$i = C\frac{dv_c}{dt} \quad (3)$$

Figure 4:
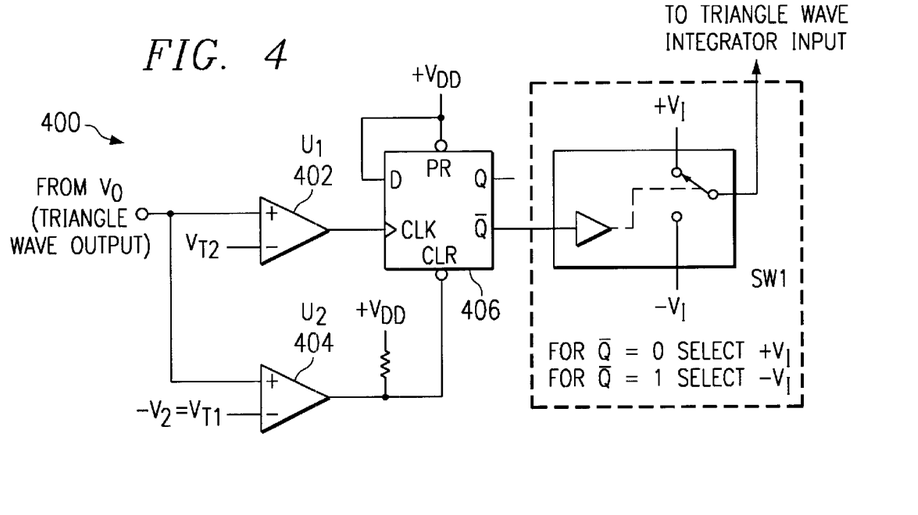
FIG. 4 is a schematic diagram illustrating a triangle wave polarity control system suitable to generate a triangle wave integrator input to implement the adaptive pulse frame rate frequency control process shown in FIG. 1.

Evaluating for $$\frac{T}{4} \le t \le \frac{T}{2},$$

$$\frac{Vi}{R} = C\frac{dv_c}{dt} \left\{ dt = \frac{T}{2} - \frac{T}{4} = \frac{T}{4}; dv_c = V_2 \right\} \quad (4)$$

$$\frac{Vi}{R} = C\frac{V_2}{T/4}$$

$$\frac{Vi}{R} = C\frac{4V_2}{T}$$

$$T = C\frac{4V_2}{Vi/R}$$

$$T = 4CR\left(\frac{V_2}{Vi}\right) \quad (5)$$

where: $V_2$ is the switching threshold for the triangle wave polarity controller depicted in FIG. 4 and which forms part of the triangle waveform generator 114 depicted in FIG. 1; $V_i$ is the input signal to the triangle wave generator (positive and negative polarity voltage references) and that is generated by the triangle wave polarity controller depicted in FIG. 4; $V_2=-V_1$ (for symmetrical triangle waveform); R is an integrating resistor; and C is an integrating capacitor.

FIG. 4 is a schematic diagram illustrating a triangle wave polarity control system 400 suitable to generate a triangle wave integrator input signal $V_i$ necessary to implement the adaptive pulse frame rate frequency control process and system 100 shown in FIG. 1, wherein $V_{T2} \sim V_2$ level $\{V_{T2}=V_2+\text{input offset of } U1 \text{ comparator } 402\}$ and $V_{T1} \sim V_1$ level $\{V_{T1}=V_1+\text{input offset of } U2 \text{ comparator } 404\}$.

When the triangle waveform 200 integrates upward and reaches the $V_{T2} \sim V_2$ level, the D-flip flop 406 is clocked (set). This causes the switch SW1 to select the positive reference voltage $+V_1$. This positive reference $(+V_1)$ voltage causes the inverting integrating amplifier 300 to begin to integrate downward. When the triangle waveform integrates downward, the output of the U2 comparator 404 will go low when its input (triangle wave generator 300 output $V_O$) equals the $V_{T1} \sim V_1$ level, which causes the D-flip flop 406 to reset. At this point, the switch SW1 selects the negative voltage reference $(-V_1)$. This negative voltage causes the inverting integrator 300 to begin to integrate the triangle wave output 200 to a more positive value. When the triangle waveform reaches $V_{T2} \sim V_2$, the output of the U1 comparator 402 clocks the D-flip flop 406 and the next triangle waveform cycle begins. Most preferably, low noise positive and negative polarity voltage references can be input at the terminals of the switch SW1 to enable the inverting triangle wave integrator 300 to produce a very low noise, high precision triangle waveform at its output.

As derived herein above, $T=4RC(V_2/V_1)$. The triangle wave 200 frequency is therefore $Freq=1/T=V_i/4RCV_2$. The frequency of the triangle wave generator 114 is directly proportional to the input voltage applied to the inverting integrator 300 which, as described above, can be derived from the positive and negative voltage reference levels. The frequency of the generator 114 can also be changed by changing the values of R, C, and $V_2$ which are inversely proportional to the triangle waveform 200 frequency. It can be appreciated that the triangle waveform frequency can be rewritten as $$Freq=(V_i/R)(1/4CV_2)=i/4CV_2 \quad (6)$$

where i is a current source. The triangle waveform frequency is therefore directly proportional to the level of current from a current source. When using a current source to generate the triangle waveform frequency, generation of the positive and negative triangle waveform slopes requires both current sourcing and current sinking to be utilized.

Figure 5:
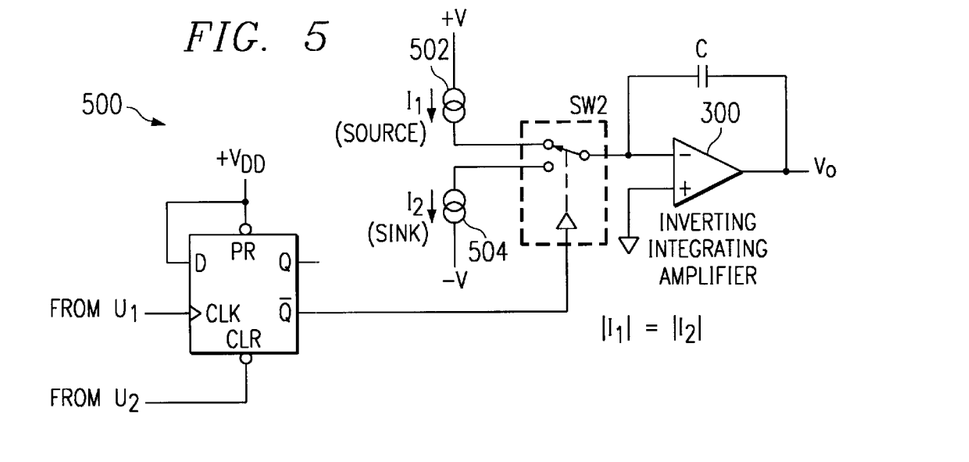
FIG. 5 is a schematic diagram illustrating a triangle wave polarity control system using combined current source and sink topologies.

FIG. 5 is a schematic diagram illustrating a one portion 500 of the triangle wave polarity control system 400 using such combined current source and sink topologies. It can be seen that the triangle wave polarity control system 400 has been modified by changing the switch from the SW1 to the SW2 configuration. A current source 502 and a current sink 504 at the input of the inverting integrator stage 300 can be seen to replace the input resistor R along with the positive and negative voltage references $(+V_1, -V_1)$ that were connected to the switch SW1. The current sources $I_1$ (source configuration) and $I_2$ (current sink configuration) are seen connected to the inverting input of the integrator 300 via switch SW2. Most preferably, $I_1$ will be selected when the positive polarity voltage reference was chosen ($\overline{Q}=0$). The current sink $I_2$ will be chosen at the same time as the negative polarity voltage reference was selected ($\overline{Q}=1$). Either a voltage reference with a resistor is used to provide the current to the inverting integrator stage 300, or an appropriately scaled current source of the appropriate polarity can be used. Alternatively, a combination of both techniques can be implemented to provide the requisite current sourcing and current sinking requirements.

Figure 6:
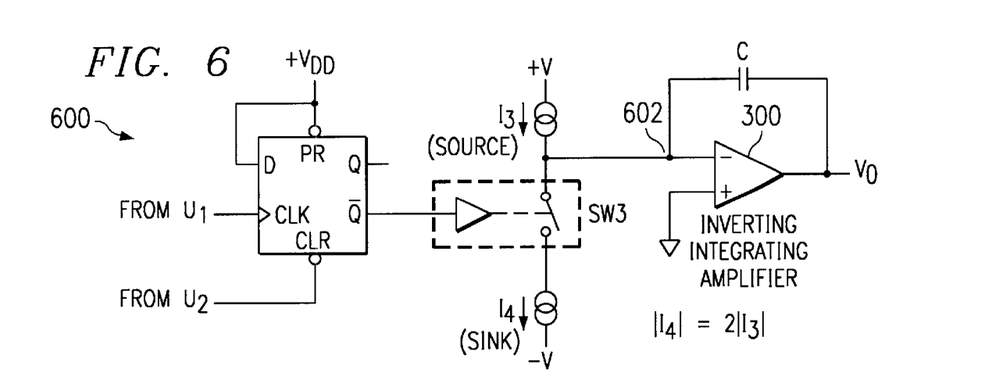
FIG. 6 is a schematic diagram illustrating another triangle wave polarity control system using a combined current source and sink topology.

FIG. 6 is a schematic diagram illustrating a portion 600 of the triangle wave polarity control system 400 using a combined current source and sink topology in which the current source $I_3$ remains connected at all times. At the point where a positive polarity voltage reference was selected ($\overline{Q}=0$), switch SW3 is open. When the negative polarity voltage reference was selected ($\overline{Q}=1$), switch SW3 will close and sink current $I_4$ will sink the necessary current. Since $I_3$ sources and $I_4$ sinks current, $I_4$ must be two times the value of $I_3$ for negative current to flow through the integration capacitor C.

The system configuration depicted in FIG. 6 is advantageous over the system configuration depicted in FIG. 5 since the inverting input 602 is always connected to a current source (no dead time). During the dead time of a triangle waveform generator, errors in the output waveform from drift and input offsets can cause anomalies such as glitches and flat spots in the triangle waveform which can degrade the switching amplifier's 300 performance.

Figure 7:
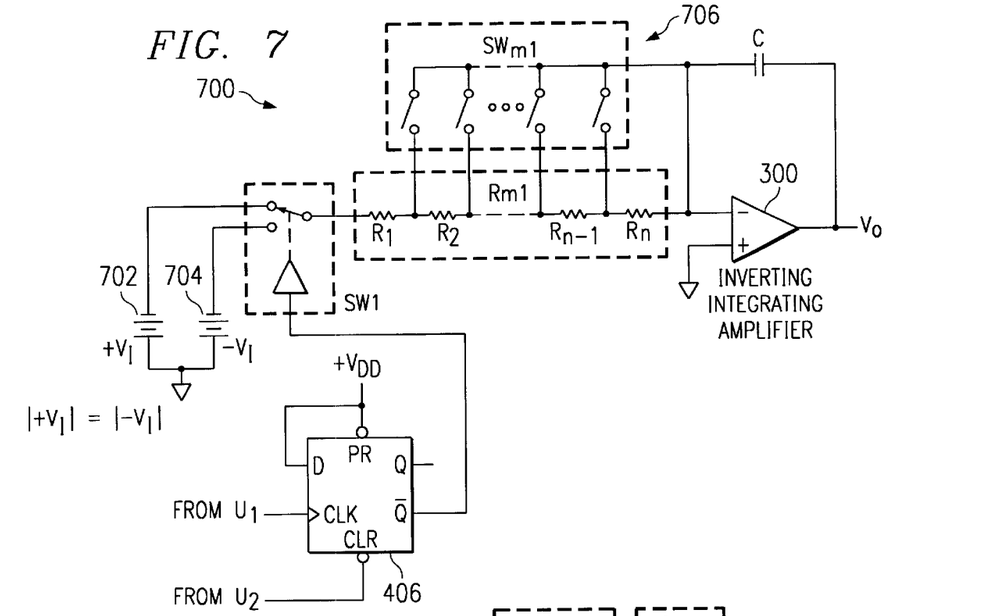
FIG. 7 is a schematic diagram illustrating a triangle wave polarity control system using a switched resistor matrix to allow programming of the triangle waveform frequency.

FIG. 7 is a schematic diagram illustrating a portion 700 of the triangle wave polarity control system 400 using a switched resistor matrix 706 to allow programming of the triangle waveform frequency F. As can be seen with reference to equation 6 discussed herein above, implementing high performance systems requires low noise, highly linear triangle waveform generators. FIGS. 8–13 discussed herein below exemplify circuit architectures for implementing frequency control in accordance with various embodiments of the present invention. Looking again at FIG. 7, positive and negative voltage sources (702, 704) are seen connected to an inverting integrator 300 through switched resistor matrix 706 that is controlled, by a D-flip flop 406 output as described herein before. When all switches within switched resistor matrix 706 are open, then $$F_{(min)} = \frac{Vi}{4CV_2(R_1 + R_2 + \ldots + R_{n-1} + R_n)} \qquad (7)$$

and when all switches within switched resistor matrix 706 are closed, then $$F_{(max)} = \frac{Vi}{4CV_2R_1} \qquad (8)$$

Further, it can be seen that a tapped resistor Rm1 replaces the single value of resistance R shown in FIG. 3. A switch matrix SWm1 is used with tapped resistor Rm1 to allow programming of the triangle waveform frequency. When all switches within SWm1 are open, Rm1 achieves its maximum resistance value that results in the lowest frequency which can be set by the value of Rm1. When all switches within SWm1 are closed, the triangle waveform frequency is at its highest value. The maximum programmable frequency is set by the, value of R1. Combinations of switches open and switches closed allow for the triangle waveform frequency to be programmed between the maximum and minimum frequencies as discussed above. In view of the foregoing, it is easily understood that the triangle waveform frequency decreases as the value of R increases.

Figure 8:
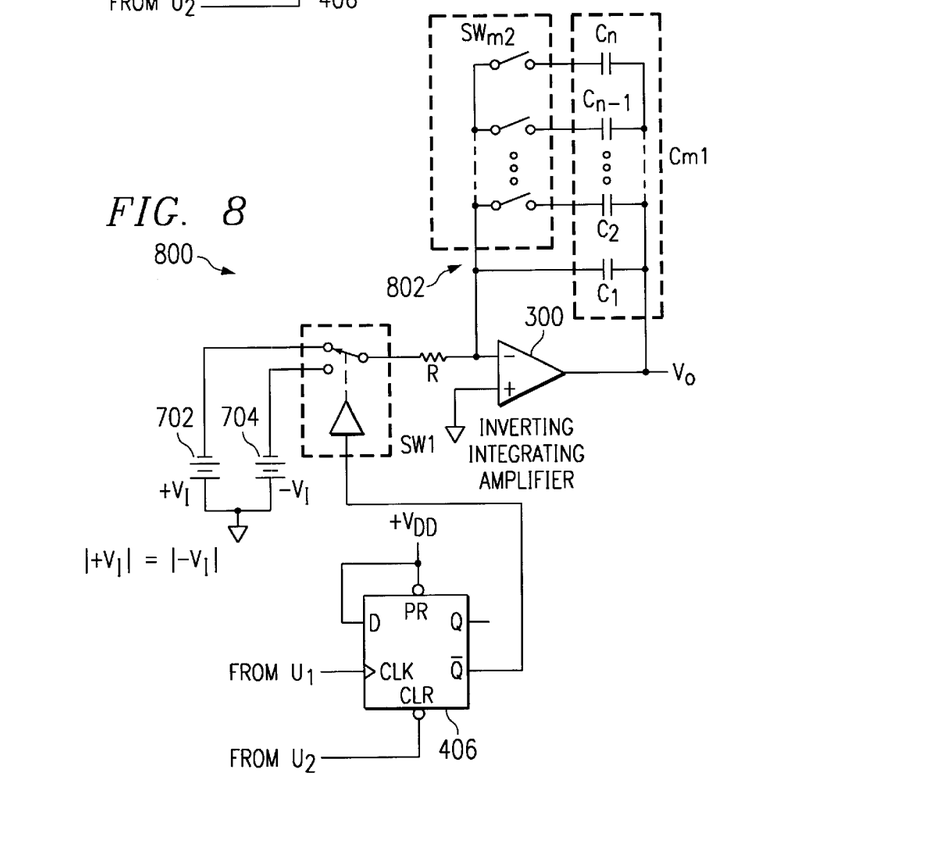
FIG. 8 is a schematic diagram illustrating a triangle wave polarity control system using a switched capacitor matrix to allow programming of the triangle waveform frequency.

FIG. 8 is a schematic diagram illustrating a portion 800 of the triangle wave polarity control system 400 using a switched capacitor matrix 802 to allow programming of the triangle waveform frequency. Again, positive and negative voltage sources 702, 704 connect to an inverting integrator 300 through switch SW1 that is controlled by a D-flip flop 406 as discussed herein above. A bank of capacitors Cm1 is switched in as needed through switch matrix SWm2. When all switches within switched capacitor matrix 802 are open, then $$F_{(max)} = \frac{Vi}{4CV_2C_1} \qquad (9)$$

and when all switches within switched capacitor matrix 802 are closed, then $$F_{(min)} = \frac{Vi}{4RV_2(C_1 + C_2 + \ldots + C_{n-1} + C_n)} \qquad (10)$$

Frequency programmability is achieved by selecting the proper value of capacitor for the desired triangle wave frequency. When all of the switches are open, the value of $C_1$ will set the maximum triangle waveform frequency. When all of the switches are closed, the highest value of capacitance will be used in the generator resulting in the lowest programmable frequency of the generator. Combinations of SWm2 switches which are open and closed will result in intermediate values for the triangle wave frequency.

Figure 9:
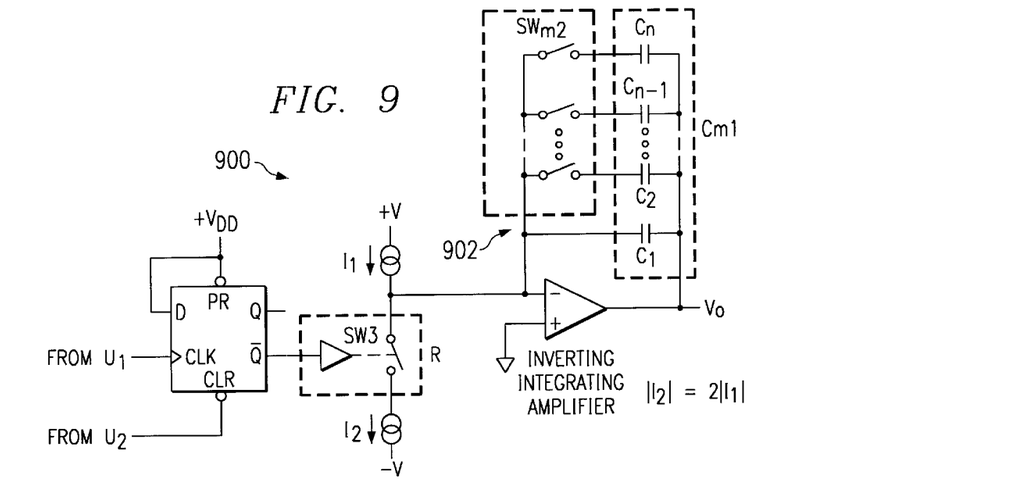
FIG. 9 is a schematic diagram illustrating a triangle wave polarity control system using current sources in combination with a programmable capacitor bank to allow programming of the triangle waveform frequency.

FIG. 9 is a schematic diagram illustrating a portion 900 of the triangle wave polarity control system 400 using current sources ($I_1, I_2$) in combination with a programmable capacitor bank 902 to allow programming of the triangle waveform frequency. Frequency programmability is achieved by selection of capacitor values as discussed herein before with reference to FIG. 8. The architecture depicted in FIG. 9 however, uses current sources ($I_1, I_2$) instead of voltage sources to charge and discharge the integrator capacitor C. When all switches within programmable capacitor bank 902 are open, then $$F_{(max)} = \frac{i_i}{4V_2C_1} \qquad (11)$$

and when all switches within programmable capacitor bank 902 are closed, then $$F_{(min)} = \frac{i_i}{4V_2(C_1 + C_2 + \ldots + C_{n-1} + C_n)} \qquad (12)$$

As capacitance increases with closed switches, the triangle wave generator frequency is decreased. When all switches are open, the capacitor value is $C_1$ and the triangle wave frequency is the highest that can be programmed. Programmed combinations of SWm2 switches which are open and closed will result in intermediate values for the triangle wave frequency.

Figure 10:
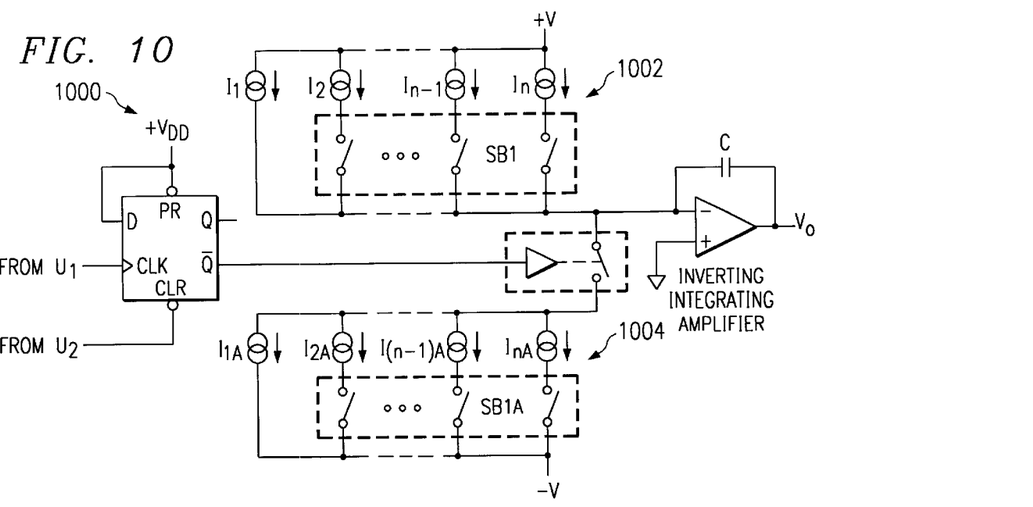
FIG. 10 is a schematic diagram illustrating a triangle wave polarity control system using programmable current sources to allow programming of the triangle waveform frequency.

FIG. 10 is a schematic diagram illustrating a portion 1000 of the triangle wave polarity control system 400 using programmable current sources 1002, 1004 to allow programming of the triangle waveform frequency. Frequency programmability is achieved by programming various levels of current from the current sources ($I_1$–$I_n$, $I_{1A}$–$I_{nA}$). When switch bank SB1 is programmed, the corresponding switch (same position/current weighting relative to the switch bank)

is also selected. The upper programmable current sources 1002 provide substantially one-half the corresponding sink value as discussed herein before. When all switches within programmable current sources 1002, 1004 are open, then $$F_{(min)} = \frac{I_1}{4V_2C} \qquad (13)$$

and when all switches with programmable current sources 1002, 1004 are closed, then $$F_{(max)} = \frac{(I_1 + I_2 + \ldots + I_{n-1} + I_n)}{4V_2C} \qquad (14)$$

When programming selects all of the switches to be closed, the highest current is achieved. This condition represents the highest frequency of the triangle wave generator. When all of the switches are programmed open, minimum current $I_1$ flows and the triangle waveform is at its lowest frequency setting. Programmed combinations of open and closed switches yield intermediate frequency outputs from the generator.

Figure 11:
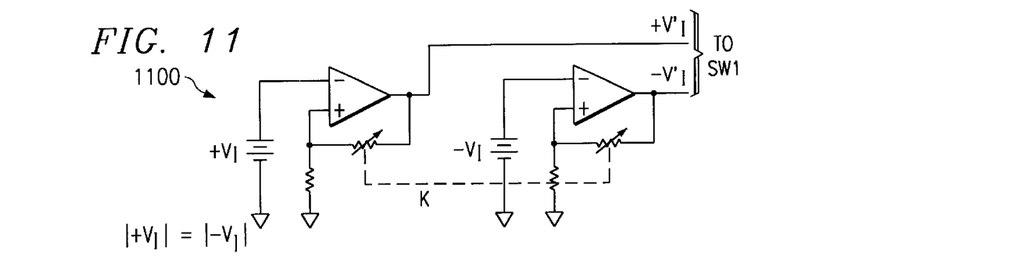
FIG. 11 is a schematic diagram illustrating a triangle wave polarity control system using a programmable input source voltage to allow programming of the triangle waveform frequency.

FIG. 11 is a schematic diagram illustrating a portion 1100 of the triangle wave polarity control system 400 using a programmable input source voltage to allow programming of the triangle waveform frequency. As $|V_i|$ increases, the frequency of the triangle wave generator increases. By providing $+V'_1$ and $-V'_1$ in which $|+V'_1|=|-V'_1|$ and $V'_1 = KV_1$, the triangle waveform frequency can be controlled simply by controlling the gain K which is programmable.

Figure 12A:
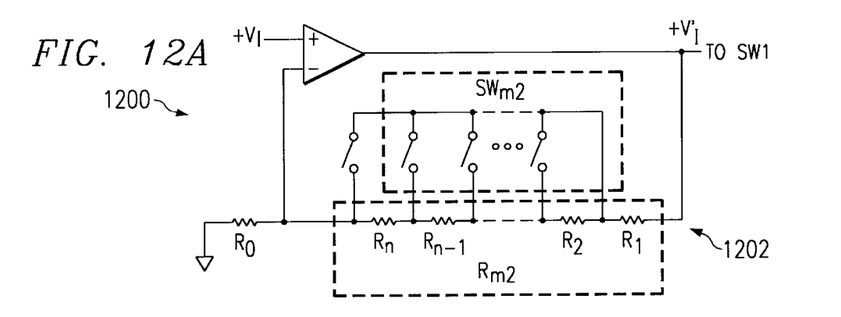
FIGS. 12A, B are schematic diagrams illustrating a triangle wave polarity control system using a programmable gain amplifier to allow programming of the triangle waveform frequency.
Figure 12B:
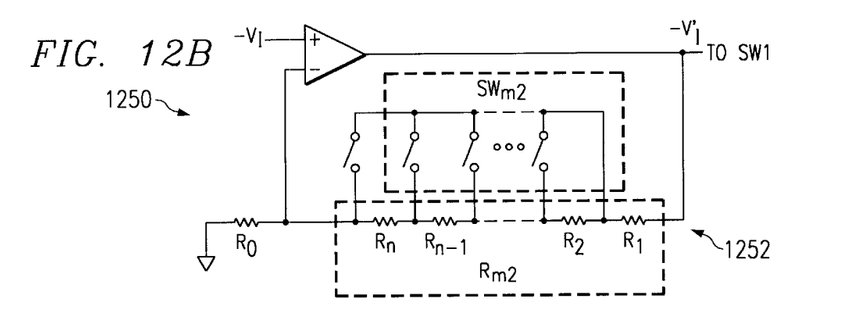

FIGS. 12A, B are schematic diagrams illustrating portions 1200, 1250 of the triangle wave polarity control system 400 using a programmable gain amplifier to allow programming of the triangle waveform frequency. The programmable gain amplifier uses a tapped resistor network 1202, 1252 with switches connected at each tap. The inverting input voltage $V'_1$ is obtained by programming the switches to change the feedback resistor (Rm2) value. When all switches are closed, the lowest gain is achieved, and then $$V'_1 = V_1\left(1 + \frac{R_1}{R_0}\right) \qquad (15)$$

and when all switches are open, the highest gain is achieved, and then $$V'_1 = V_1\left(1 + \frac{R_1 + R_2 + \ldots R_{n-1} + R_n}{R_0}\right) \qquad (16)$$

for $$F = \frac{V_i}{4RCV_2}$$

In this case, the highest $V'_1$ gives the highest $V_1$, and therefore the highest frequency. When all switches are closed, the lowest $V'_1$ value is selected, which yields the lowest frequency for the range of programmable frequency of the triangle waveform generator 114.

Figure 13A:
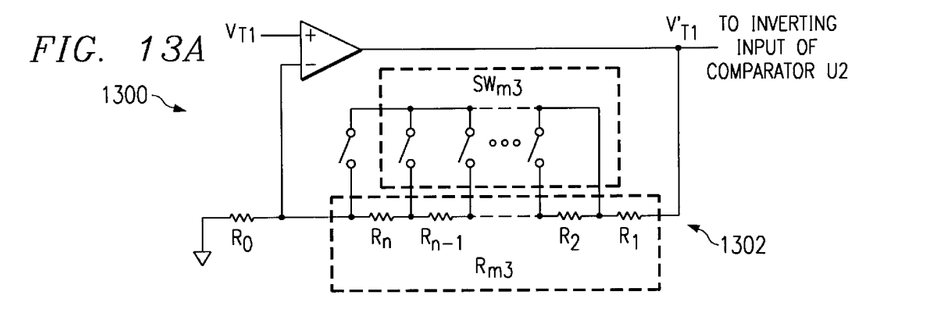
FIGS. 13A, B are schematic diagrams illustrating a triangle wave polarity control system using a programmable threshold level to allow programming of the triangle waveform frequency.
Figure 13B:
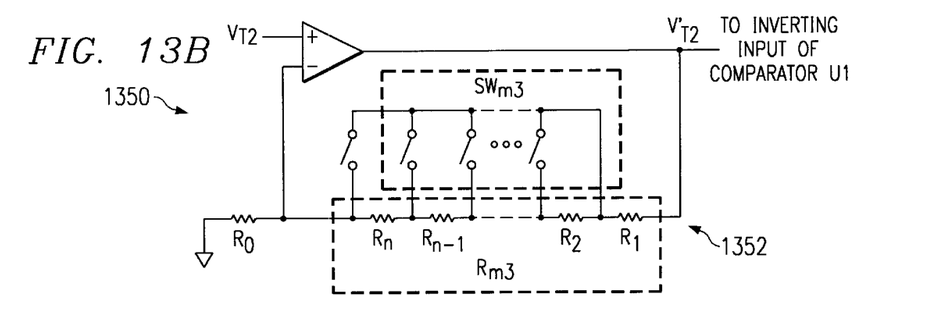

FIGS. 13A, B are schematic diagrams illustrating portions 1300, 1350 of the triangle wave polarity control system 400, each respective portion using a programmable threshold level to allow programming of the triangle waveform frequency in which $V_2$ limits are defined by $-V_{T1=VT2}$. Voltages $V'_{T1}$ and $V'_{T2}$ are obtained by programming the switches SWm3 for the tapped resistor in the opamp feedback path for each portion 1300, 1350. When all switches in SWm3 switch matrix 1302 and SWm3 switch matrix 1352 are programmed closed, the lowest value (gain) is obtained and $$V'_{TI} = V_{TI}\left(1 + \frac{R_1}{R_0}\right) \qquad (17)$$

When all switches in SWm3 switch matrix 1302 and SWm3 switch matrix 1352 are programmed open, the largest gain occurs and $$V'_{TI} = V_{TI}\left(1 + \frac{R_1 + R_2 + \ldots R_{n-1} + R_n}{R_0}\right) \qquad (18)$$

The frequency of the triangle generator is lowest of the programmable range for the largest programmed values of $V'_{T1}$. The lowest value of $V_{T1}$ yields the highest frequency of the programmable range to be obtained. Intermediate frequencies can be obtained through programming combinations of open and closed switches of SWm3 switch matrix 1302 and 1352.

In view of the foregoing, it can be appreciated the present invention presents a significant advancement in the art of integrated switching amplifier systems. Further, this invention has been described in considerable detail in order to provide those skilled in the data communication art with the information needed to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow. For example, although various embodiments have been presented herein with reference to particular functional architectures and algorithmic characteristics, the present inventive structures and methods are not necessarily limited to such a particular architecture or set of characteristics as used herein.

What is claimed is:

1. A switching amplifier frequency control system comprising:
    a triangle wave integrator amplifier having an input and an output; and
    a controller having an input in communication with the integrator amplifier output and further having an output in communication with the integrator amplifier input, wherein the controller operates to selectively adjust a voltage signal amplitude at the input of the integrator amplifier such that the integrator amplifier will generate a triangle wave having a desired frequency,
    wherein the controller comprises:
        a bistable element having a first input, a second input and an output;
        a first voltage comparator in communication with the bistable element first input;
        a second voltage comparator in communication with the bistable element second input; and
        a switch having a first input in communication with the bistable element output, a second input connected to a positive voltage, a third input connected to a negative voltage, and an output, wherein the switch is responsive to a bistable signal generated at the bistable element output such that the switch passes the positive voltage to the switch output when the bistable element is in a first state and further such that the switch passes the negative voltage to the switch output when the bistable element is in a second state.

2. The switching amplifier frequency control system according to claim 1 wherein the first voltage comparator has a first input and a second input and further wherein the second voltage comparator has a first input and a second input, wherein the first input of the first voltage comparator is connected to the first input of the second voltage comparator and is configured to receive a triangle wave signal generated at the output of the triangle wave integrator amplifier, and further wherein the second input of the first voltage comparator is connected to a positive reference voltage and the second input of the second voltage comparator is connected to a negative reference voltage such that the first voltage comparator will cause the bistable element to enter a first state when the triangle wave signal is equal to the positive reference voltage and further such that the second voltage comparator will cause the bistable element to enter a second state when the triangle wave signal is equal to the negative reference voltage.

3. The switching amplifier frequency control system according to claim 1 further comprising a first programmable gain amplifier in communication with the first voltage comparator and operational to generate a bistable element clock signal when a first threshold voltage level is reached.

4. The switching amplifier frequency control system according to claim 3 further comprising a second programmable gain amplifier in communication with the second voltage comparator and operational to generate a bistable element clear signal when a second threshold voltage level is reached.

5. A switching amplifier frequency control system comprising:
a triangle wave integrator amplifier having an input and an output; and
a controller having an input in communication with the integrator amplifier output and further having an output in communication with the integrator amplifier input, wherein the controller operates to selectively adjust a voltage signal amplitude at the input of the integrator amplifier such that the integrator amplifier will generate a triangle wave having a desired frequency,
wherein the controller comprises:
a bistable element having a first input, a second input and an output;
a first voltage comparator in communication with the bistable element first input;
a second voltage comparator in communication with the bistable element second input; and
a switch having a first input in communication with the bistable element output, a second input connected to a current source, a third input connected to a current sink, and an output, wherein the switch is responsive to a bistable signal generated at the bistable element output such that the switch can pass a source current to the switch output when the bistable element is in a first state and further such that the switch can sink a current received at the switch output when the bistable element is in a second state.

6. The switching amplifier frequency control system according to claim 5 wherein the current source is permanently in communication with the triangle wave integrator amplifier input.

7. The switching amplifier frequency control system according to claim 6 wherein the first voltage comparator has a first input and a second input and further wherein the second voltage comparator has a first input and a second input, wherein the first input of the first voltage comparator is connected to the first input of the second voltage comparator and is configured to receive a triangle wave signal generated at the output of the triangle wave integrator amplifier, and further wherein the second input of the first voltage comparator is connected to a positive reference voltage and the second input of the second voltage comparator is connected to a negative reference voltage such that the first voltage comparator will cause the bistable element to enter a first state when the triangle wave signal is equal to the positive reference voltage and further such that the second voltage comparator will cause the bistable element to enter a second state when the triangle wave signal is equal to the negative reference voltage.

8. The switching amplifier frequency control system according to claim 6 further comprising a first programmable gain amplifier in communication with the first voltage comparator and operational to generate a bistable element clock signal when a first threshold voltage level is reached.

9. The switching amplifier frequency control system according to claim 8 further comprising a second programmable gain amplifier in communication with the second voltage comparator and operational to generate a bistable element clear signal when a second threshold voltage level is reached.

10. A switching amplifier frequency control system comprising:
a triangle wave integrator amplifier having an input and an output; and
a controller having an input in communication with the integrator amplifier output and further having an output in communication with the integrator amplifier input, wherein the controller operates to selectively adjust a voltage signal amplitude at the input of the integrator amplifier such that the integrator amplifier will generate a triangle wave having a desired frequency,
wherein the controller comprises:
a bistable element having a first input, a second input and an output;
a first voltage comparator in communication with the bistable element first input;
a second voltage comparator in communication with the bistable element second input;
a switch having a first input in communication with the bistable element output, a second input connected to a positive voltage source, a third input connected to a negative voltage source, and an output, wherein the switch is responsive to a bistable signal generated at the bistable element output such that the switch can pass a positive voltage to the switch output when the bistable element is in a first state and further such that the switch can a negative voltage to the switch output when the bistable element is in a second state; and
a programmable resistor switch matrix having an input in communication with the switch output and further having an output, wherein the switch matrix is programmable to select a desired resistance value between the switch output and the triangle wave integrator amplifier input and thereby cause the triangle wave integrator amplifier to switch at a desired frequency.

11. The switching amplifier frequency control system according to claim 10 wherein the first voltage comparator has a first input and a second input and further wherein the second voltage comparator has a first input and a second input, wherein the first input of the first voltage comparator is connected to the first input of the second voltage comparator and is configured to receive a triangle wave signal generated at the output of the triangle wave integrator amplifier, and further wherein the second input of the first voltage comparator is connected to a positive reference voltage and the second input of the second voltage comparator is connected to a negative reference voltage such that the first voltage comparator will cause the bistable element to enter a first state when the triangle wave signal is equal to the positive reference voltage and further such that the second voltage comparator will cause the bistable element to enter a second state when the triangle wave signal is equal to the negative reference voltage.

12. The switching amplifier frequency control system according to claim 10 further comprising a first programmable gain amplifier in communication with the first voltage comparator and operational to generate a bistable element clock signal when a first threshold voltage level is reached.

13. The switching amplifier frequency control system according to claim 12 further comprising a second programmable gain amplifier in communication with the second voltage comparator and operational to generate a bistable element clear signal when a second threshold voltage level is reached.

14. A switching amplifier frequency control system comprising:
a triangle wave integrator amplifier having an input and an output; and
a controller having an input in communication with the integrator amplifier output and further having an output in communication with the integrator amplifier input, wherein the controller operates to selectively adjust a voltage signal amplitude at the input of the integrator amplifier such that the integrator amplifier will generate a triangle wave having a desired frequency,
wherein the controller comprises:
a bistable element having a first input, a second input and an output;
a first voltage comparator in communication with the bistable element first input;
a second voltage comparator in communication with the bistable element second input;
a switch having a first input in communication with the bistable element output, a second input connected to a positive voltage source, a third input connected to a negative voltage source, and an output, wherein the switch is responsive to a bistable signal generated at the bistable element output such that the switch can pass a positive voltage to the switch output when the bistable element is in a first state and further such that the switch can a negative voltage to the switch output when the bistable element is in a second state; and
a programmable capacitor switch matrix having an input in communication with the switch output and further having an output in communication with the triangle wave integrator amplifier output, wherein the switch matrix is programmable to select a desired capacitive value between the triangle wave integrator amplifier input and the triangle wave integrator amplifier output and thereby cause the triangle wave integrator amplifier to switch at a desired frequency.

15. The switching amplifier frequency control system according to claim 14 wherein the first voltage comparator has a first input and a second input and further wherein the second voltage comparator has a first input and a second input, wherein the first input of the first voltage comparator is connected to the first input of the second voltage comparator and is configured to receive a triangle wave signal generated at the output of the triangle wave integrator amplifier, and further wherein the second input of the first voltage comparator is connected to a positive reference voltage and the second input of the second voltage comparator is connected to a negative reference voltage such that the first voltage comparator will cause the bistable element to enter a first state when the triangle wave signal is equal to the positive reference voltage and further such that the second voltage comparator will cause the bistable element to enter a second state when the triangle wave signal is equal to the negative reference voltage.

16. The switching amplifier frequency control system according to claim 14 further comprising a first programmable gain amplifier in communication with the first voltage comparator and operational to generate a bistable element clock signal when a first threshold voltage level is reached.

17. The switching amplifier frequency control system according to claim 16 further comprising a second programmable gain amplifier in communication with the second voltage comparator and operational to generate a bistable element clear signal when a second threshold voltage level is reached.

18. A switching amplifier frequency control system comprising:
a triangle wave integrator amplifier having an input and an output; and
a controller having an input in communication with the integrator amplifier output and further having an output in communication with the integrator amplifier input, wherein the controller operates to selectively adjust a voltage signal amplitude at the input of the integrator amplifier such that the integrator amplifier will generate a triangle wave having a desired frequency,
wherein the controller comprises:
a bistable element having a first input, a second input and an output;
a first voltage comparator in communication with the bistable element first input;
a second voltage comparator in communication with the bistable element second input;
a switch having a first input in communication with the bistable element output, a second input connected to a current source, a third input connected to a current sink, and an output, wherein the switch is responsive to a bistable signal generated at the bistable element output such that the switch can pass a source current to the switch output when the bistable element is in a first state and further such that the switch can sink a current received at the switch output when the bistable element is in a second state; and
a programmable capacitor switch matrix having an input in communication with the switch output and further having an output in communication with the triangle wave integrator amplifier output, wherein the switch matrix is programmable to select a desired capacitive value between the triangle wave integrator amplifier input and the triangle wave integrator amplifier output and thereby cause the triangle wave integrator amplifier to switch at a desired frequency.

19. The switching amplifier frequency control system according to claim 18 wherein the first voltage comparator has a first input and a second input and further wherein the second voltage comparator has a first input and a second input, wherein the first input of the first voltage comparator is connected to the first input of the second voltage comparator and is configured to receive a triangle wave signal generated at the output of the triangle wave integrator amplifier, and further wherein the second input of the first voltage comparator is connected to a positive reference voltage and the second input of the second voltage comparator is connected to a negative reference voltage such that the first voltage comparator will cause the bistable element to enter a first state when the triangle wave signal is equal to the positive reference voltage and further such that the second voltage comparator will cause the bistable element to enter a second state when the triangle wave signal is equal to the negative reference voltage.

20. The switching amplifier frequency control system according to claim 18 further comprising a first programmable gain amplifier in communication with the first voltage comparator and operational to generate a bistable element clock signal when a first threshold voltage level is reached.

21. The switching amplifier frequency control system according to claim 20 further comprising a second programmable gain amplifier in communication with the second voltage comparator and operational to generate a bistable element clear signal when a second threshold voltage level is reached.

22. A switching amplifier frequency control system comprising:
   a triangle wave integrator amplifier having an input and an output; and
   a controller having an input in communication with the integrator amplifier output and further having an output in communication with the integrator amplifier input, wherein the controller operates to selectively adjust a voltage signal amplitude at the input of the integrator amplifier such that the integrator amplifier will generate a triangle wave having a desired frequency,
   wherein the controller comprises:
      a bistable element having a first input, a second input and an output;
      a first voltage comparator in communication with the bistable element first input;
      a second voltage comparator in communication with the bistable element second input;
      a programmable current source switch matrix;
      a programmable current sink switch matrix;
      a switch having a first input in communication with the bistable element output, a second input connected to the programmable current source switch matrix, a third input connected to the programmable current sink switch matrix, and an output, wherein the switch is responsive to a bistable signal generated at the bistable element output such that the switch can pass a programmed value of source current to the switch output when the bistable element is in a first state and further such that the switch can sink a programmed value of sink current received at the switch output when the bistable element is in a second state and thereby cause the triangle wave integrator amplifier to switch at a desired frequency.

23. The switching amplifier frequency control system according to claim 22 wherein the first voltage comparator has a first input and a second input and further wherein the second voltage comparator has a first input and a second input, wherein the first input of the first voltage comparator is connected to the first input of the second voltage comparator and is configured to receive a triangle wave signal generated at the output of the triangle wave integrator amplifier, and further wherein the second input of the first voltage comparator is connected to a positive reference voltage and the second input of the second voltage comparator is connected to a negative reference voltage such that the first voltage comparator will cause the bistable element to enter a first state when the triangle wave signal is equal to the positive reference voltage and further such that the second voltage comparator will cause the bistable element to enter a second state when the triangle wave signal is equal to the negative reference voltage.

24. The switching amplifier frequency control system according to claim 22 further comprising a first programmable gain amplifier in communication with the first voltage comparator and operational to generate a bistable element clock signal when a first threshold voltage level is reached.

25. The switching amplifier frequency control system according to claim 24 further comprising a second programmable gain amplifier in communication with the second voltage comparator and operational to generate a bistable element clear signal when a second threshold voltage level is reached.

26. A switching amplifier frequency control system comprising:
   a triangle wave integrator amplifier having an input and an output; and
   a controller having an input in communication with the integrator amplifier output and further having an output in communication with the integrator amplifier input, wherein the controller operates to selectively adjust a voltage signal amplitude at the input of the integrator amplifier such that the integrator amplifier will generate a triangle wave having a desired frequency,
   wherein the controller comprises:
      a bistable element having a first input, a second input and an output;
      a first voltage comparator in communication with the bistable element first input;
      a second voltage comparator in communication with the bistable element second input;
      a first programmable gain amplifier;
      a second programmable gain amplifier; and
      a switch having a first input in communication with the bistable element output, a second input connected to the first programmable gain amplifier, a third input connected to the second programmable gain amplifier, and an output, wherein the switch is responsive to a bistable signal generated at the bistable element output such that the switch can pass a programmed positive voltage to the switch output when the bistable element is in a first state and further such that the switch can pass a programmed negative voltage to the switch output when the bistable element is in a second state and thereby cause the triangle wave integrator amplifier to switch at a desired frequency.

27. The switching amplifier frequency control system according to claim 26 wherein the first voltage comparator has a first input and a second input and further wherein the second voltage comparator has a first input and a second input, wherein the first input of the first voltage comparator is connected to the first input of the second voltage comparator and is configured to receive a triangle wave signal generated at the output of the triangle wave integrator amplifier, and further wherein the second input of the first voltage comparator is connected to a positive reference voltage and the second input of the second voltage comparator is connected to a negative reference voltage such that the first voltage comparator will cause the bistable element to enter a first state when the triangle wave signal is equal to the positive reference voltage and further such that the second voltage comparator will cause the bistable element to enter a second state when the triangle wave signal is equal to the negative reference voltage.

28. The switching amplifier frequency control system according to claim 26 further comprising a first programmable gain amplifier in communication with the first voltage comparator and operational to generate a bistable element clock signal when a first threshold voltage level is reached.

29. The switching amplifier frequency control system according to claim 28 further comprising a second programmable gain amplifier in communication with the second voltage comparator and operational to generate a bistable element clear signal when a second threshold voltage level is reached.

* * * * *